US012473470B2

(12) United States Patent
Yamaguchi et al.

(10) Patent No.: US 12,473,470 B2
(45) Date of Patent: *Nov. 18, 2025

(54) PHOTOCURABLE ADHESIVE

(71) Applicants: DENSO CORPORATION, Kariya (JP); ADEKA CORPORATION, Tokyo (JP)

(72) Inventors: Kazuma Yamaguchi, Kariya (JP); Takao Izumi, Kariya (JP); Keisuke Ota, Kuki (JP); Kohei Hirayama, Kuki (JP); Shinsuke Yamada, Kuki (JP); Ryo Ogawa, Kuki (JP)

(73) Assignees: DENSO CORPORATION, Kariya (JP); ADEKA CORPORATION, Tokyo (JP)

( * ) Notice: Subject to any disclaimer, the term of this patent is extended or adjusted under 35 U.S.C. 154(b) by 768 days.

This patent is subject to a terminal disclaimer.

(21) Appl. No.: 17/687,733

(22) Filed: Mar. 7, 2022

(65) Prior Publication Data

US 2022/0282138 A1 Sep. 8, 2022

(30) Foreign Application Priority Data

Mar. 8, 2021 (JP) ................. 2021-036466

(51) Int. Cl.
*C09J 163/00* (2006.01)
*C09J 11/04* (2006.01)
*C09J 11/06* (2006.01)
(52) U.S. Cl.
CPC ............ *C09J 163/00* (2013.01); *C09J 11/04* (2013.01); *C09J 11/06* (2013.01); *C09J 2463/00* (2013.01)

(58) Field of Classification Search
None
See application file for complete search history.

(56) References Cited

U.S. PATENT DOCUMENTS

| | | | | |
|---|---|---|---|---|
| 8,420,213 | B2* | 4/2013 | Suzuki | H10N 30/06 |
| | | | | 428/344 |
| 10,177,059 | B2* | 1/2019 | Nakamura | H01L 21/568 |
| 2005/0231528 | A1 | 10/2005 | Shioda et al. | |
| 2014/0216544 | A1* | 8/2014 | Nakahara | C09J 11/04 |
| | | | | 252/514 |
| 2017/0098551 | A1* | 4/2017 | Nakamura | H01L 23/3135 |
| 2018/0247834 | A1* | 8/2018 | Tsuda | H01L 23/295 |
| 2022/0282139 | A1* | 9/2022 | Yamaguchi | C09J 163/00 |

FOREIGN PATENT DOCUMENTS

| | | | | |
|---|---|---|---|---|
| CN | 108831901 A | * | 11/2018 | ....... H01L 27/14603 |
| JP | 2005-221853 A | | 8/2005 | |
| JP | 4066706 B2 | * | 3/2008 | |

(Continued)

*Primary Examiner* — Sanza L. McClendon
(74) *Attorney, Agent, or Firm* — Harness, Dickey & Pierce, P.L.C.

(57) ABSTRACT

There is provided a photocurable adhesive having good deep-section curability. A photocurable adhesive is formulated to be curable by laser light irradiation. The photocurable adhesive contains an epoxy adhesive component and titanium black. The content of the titanium black is 1 ppm by mass or more and 150 ppm by mass or less relative to 100 parts by mass of the epoxy adhesive component. The titanium black may have a primary particle size of 5 nm or more and 150 nm or less.

6 Claims, 2 Drawing Sheets

(56) References Cited

FOREIGN PATENT DOCUMENTS

| | | | | |
|---|---|---|---|---|
| JP | 2010-180352 | A | 8/2010 | |
| JP | 4839564 | B2 * | 12/2011 | ............. C08G 59/18 |
| JP | 2016046300 | A * | 4/2016 | |
| JP | 2016048807 | A * | 4/2016 | ............. C09J 11/04 |
| JP | 6421974 | B2 * | 11/2018 | |
| JP | 2019159063 | A * | 9/2019 | ........... G01R 31/308 |

* cited by examiner

PHOTOCURABLE ADHESIVE

CROSS-REFERENCE TO RELATED APPLICATION

This application is based on and claims the benefit of priority from earlier Japanese Patent Application No. 2021-36466 filed Mar. 8, 2021, the description of which is incorporated herein by reference.

BACKGROUND

The present disclosure relates to a photocurable adhesive.

Photocurable adhesives formulated to be curable by light irradiation are used in various fields, taking advantages of characteristics that the time required for curing is relatively short.

SUMMARY

An aspect of the present disclosure is a photocurable adhesive (1) formulated to be curable by laser light irradiation containing an epoxy adhesive component (11), and titanium black (12) in a content of 1 ppm by mass or more and 150 ppm by mass or less relative to 100 parts by mass of the epoxy adhesive component.

It should be noted that the bracketed reference signs indicated in the claims and in the description set forth above indicate correspondence to the specific means described in the embodiments provided below, and should not limit the technical scope of the present disclosure.

DETAILED DESCRIPTION OF THE PREFERRED EMBODIMENTS

Photocurable adhesives formulated to be curable by light irradiation are used in various fields, taking advantages of characteristics that the time required for curing is relatively short. For example, JP 2010-180352 A describes a rapid photocuring epoxy adhesive composition containing an epoxy adhesive component and a light-absorbing component that can heat and cure the epoxy adhesive by absorbing laser light.

However, in the case of applying laser light to the epoxy adhesive composition of JP 2010-180352 A, the laser light does not necessarily reach deep into the adhesive composition, depending on the shape of the portion targeted to bonding, the shape of the applied adhesive composition, and the like. When the laser light does not reach deep into the adhesive composition, curing may be insufficient on the inside of the adhesive composition.

It is thus desired to provide a photocurable adhesive having deep-section curability.

An aspect of the present disclosure is a photocurable adhesive (1) formulated to be curable by laser light irradiation containing an epoxy adhesive component (11), and titanium black (12) in a content of 1 ppm by mass or more and 150 ppm by mass or less relative to 100 parts by mass of the epoxy adhesive component.

The photocurable adhesive (1) contains the titanium black (12) in the specific amount mentioned above. When the content of titanium black in the photocurable adhesive is in the specific range mentioned above and when laser light is applied to this photocurable adhesive, the laser light can easily reach deep portions of the photocurable adhesive. Consequently, deep-section curability of the photocurable adhesive can be improved.

As described above, according to the above aspect, there can be provided a photocurable adhesive (1) having good deep-section curability.

First Embodiment

Figure 1:
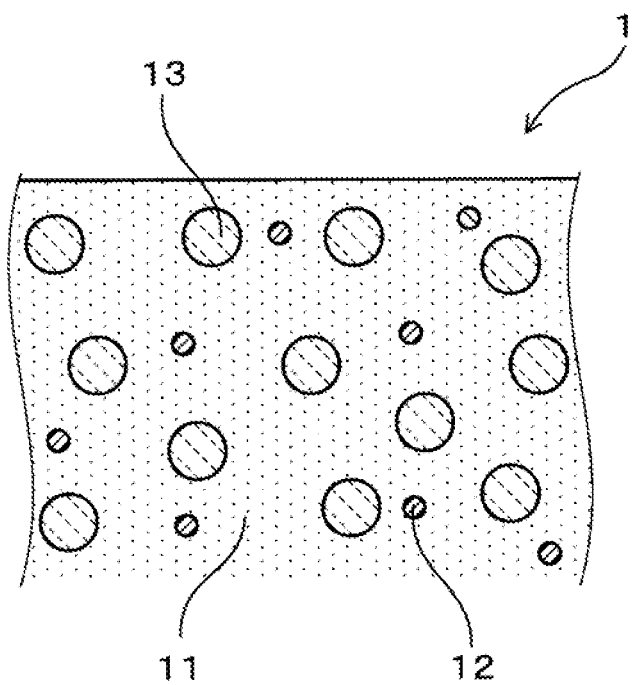
FIG. 1 is a schematic diagram illustrating a photocurable adhesive according to a first embodiment.

Referring to FIG. 1, an embodiment related to the photocurable adhesive will be described. A photocurable adhesive 1 according to the present embodiment is formulated to be curable by laser light irradiation. The laser light applied to the photocurable adhesive 1 may need to have a wavelength that causes titanium black to absorb the laser light. For example, as the laser light, a near infrared laser having a wavelength in the range of 780 nm to 3 μm can be used. The photocurable adhesive 1 contains an epoxy adhesive component 11 and titanium black 12. Hereinafter, a detailed formulation of the photocurable adhesive 1 will be described.

1. Epoxy Adhesive Component

The epoxy adhesive component 11 in the photocurable adhesive 1 is formulated to be cured by heat which is generated in the titanium black 12 when irradiated with laser light. The epoxy adhesive component 11 may contain a cyanate ester resin (A), an epoxy resin (B), and a latent amine curing agent (C). The photocurable adhesive 1 containing the cyanate ester resin (A), the epoxy resin (B), and the latent amine curing agent (C) can reduce the time required for curing after laser light irradiation.

1-1. Cyanate Ester Resin (A)

As the cyanate ester resin (A), compounds having two or more cyanate groups (—O—CN) per molecule can be used. The cyanate ester resin (A) may be, for example, at least one compound selected from the group consisting of compounds (A-1) expressed by the following General Formula (1), compounds (A-2) expressed by the following General Formula (2), and polymers (A-3) which are polymers of at least one of the compounds (A-1) and/or (A-2).

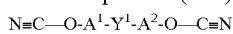

In General Formula (1), $A^1$ and $A^2$ each independently represent an unsubstituted phenylene group, or a phenylene group substituted with one or more of alkyl groups having 1 to 4 carbon atoms, and $Y^1$ represents a divalent hydrocarbon group that may have an ether bond, thioether bond, or substituent group.

General Formula (2)

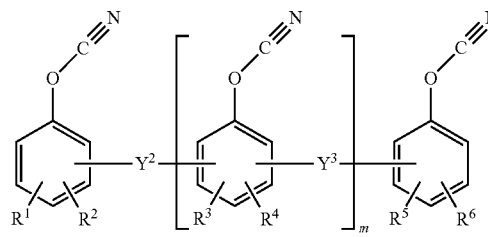

In General Formula (2), m represents an integer equal to or greater than 1, $R^1$ to $R^6$ each independently represent a hydrogen atom or an alkyl group having 1 to 4 carbon atoms, and $Y^2$ and $Y^3$ each independently represent a divalent hydrocarbon group or a fluorine-substituted divalent alkylene group.

$Y^1$ in General Formula (1) and $Y^2$ and $Y^3$ in General Formula (2) may each be, for example, divalent hydrocarbon groups expressed by the following Structural Formulae (3) to (11).

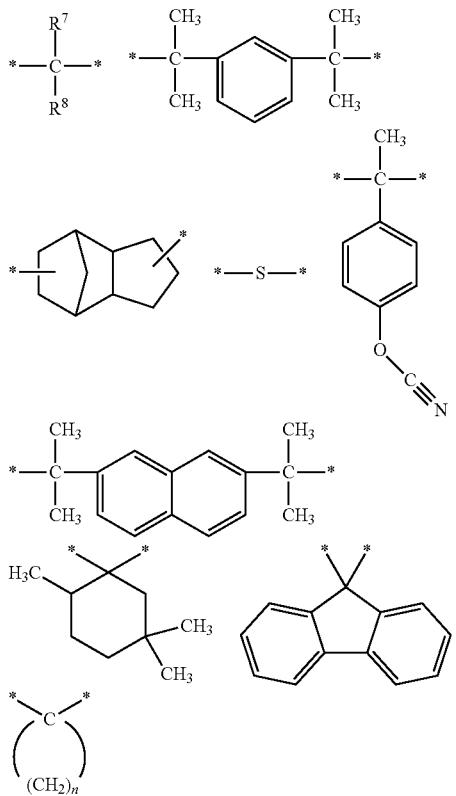

In Structural Formulae (3) to (11), the mark * represents atomic bonding. In Structural Formula (3), $R^7$ and $R^8$ each independently represent a hydrogen atom, an unsubstituted methyl group, or a fluorine-substituted methyl group. In Structural Formula (11), n represents an integer that is 4 or greater and 12 or smaller.

More specifically, the cyanate ester resin (A) is particularly preferably a bisphenol type cyanate ester resin.

1-2. Epoxy Resin (B)

As the epoxy resin (B), compounds having two or more epoxy groups per molecule can be used. The epoxy resin (B) may be formed of only one compound having epoxy groups, or may be formed of two or more of compounds having epoxy groups.

The content of the epoxy resin (B) in the photocurable adhesive 1 can be appropriately determined so as to be in the range of 1 part by mass or more and 10,000 parts by mass or less relative to 100 parts by mass of the cyanate ester resin (A). When the content of the epoxy resin (B) is 1 part by mass or more relative to 100 parts by mass of the cyanate ester resin (A), the photocurable adhesive 1 can be sufficiently cured when laser light is applied thereto. From the perspective of further enhancing curability of the photocurable adhesive 1, the content of the epoxy resin (B) is preferably 10 parts by mass or more, and more preferably 20 parts by mass or more, relative to 100 parts by mass of the cyanate ester resin (A).

When the content of the epoxy resin (B) is 10,000 parts by mass or less relative to 100 parts by mass of the cyanate ester resin (A), a cured product having good physical properties can be obtained. From the perspective of further enhancing physical properties of the cured product, the content of the epoxy resin (B) is preferably 1,000 parts by mass or less, and more preferably 500 parts by mass or less, relative to 100 parts by mass of the cyanate ester resin (A).

Examples of the epoxy resin (B) may include polyglycidyl ether compounds of mononuclear polyvalent phenolic compounds such as di hydroquinone, resorcin, pyrocatechol, and phloroglucinol; polyglycidyl ether compounds of polynuclear polyvalent phenol compounds such as hydroxynaphthalene, biphenol, methylene bisphenol (bisphenol F), methylene bis(orthocresol), ethylidene bisphenol, isopropylidene bisphenol (bisphenol A), isopropylidene bis(orthocresol), tetrabromobisphenol-A, 1,3-bis(4-hydroxycumylbenzene), 1,4-bis(4-hydroxycumylbenzene), 1,1,3-tris(4-hydroxyphenyl) butane, 1,1,2,2-tetra(4-hydroxyphenyl) ethane, thiobisphenol, sulfobisphenol, oxybisphenol, phenol novolak, orthocresol novolak, ethylphenol novolak, butylphenol novolak, octylphenol novolak, resorcin novolak, and terpene phenol; polyglycidyl ethers of polyvalent alcohols such as ethylene glycol, propylene glycol, butylene glycol, hexanediol, polyglycol, thiodiglycol, glycerin, trimethylolpropane, pentaerythritol, sorbitol, and bisphenol A ethylene oxide adduct; glycidyl esters of aliphatic, aromatic or alicyclic polybasic acid such as maleic acid, fumaric acid, itaconic acid, succinic acid, glutaric acid, suberic acid, adipic acid, azelaic acid, sebacic acid, dimeric acid, trimeric acid, phthalic acid, isophthalic acid, terephthalic acid, trimellitic acid, trimesic acid, pyromellitic acid, tetrahydrophthalic acid, hexahydrophthalic acid, and endomethylene tetrahydrophthalic acid;

homopolymers or copolymers of glycidyl methacrylate; epoxy compounds having a glycidylamino group such as N, N-diglycidylaniline, bis(4-(N-methyl-N-glycidylamino) phenyl) methane, and diglycidyl orthotoluidine; epoxy compounds of cyclic olefin compounds such as vinyl cyclohexene diepoxide, dicyclopentadiene diepoxide, 3,4-epoxycyclohexylmethyl-3,4-epoxycyclohexanecarboxylate, 3,4-epoxy-6-methylcyclohexylmethyl-6-methylcyclohexanecarboxylate, and bis(3,4-epoxy-6-methylcyclohexylmethyl) adipate; epoxidized conjugated diene polymers such as epoxidized polybutadiene and epoxidized styrene-butadiene copolymer; and heterocyclic compounds such as triglycidyl isocyanurate.

These compounds may be internally cross-linked by a prepolymer of terminal isocyanate, or may be high molecular weighted by a polyvalent active hydrogen compound (polyphenols, polyamines, carbonyl group-containing compounds, polyphosphoric acid esters, etc.).

From the perspective of reactivity, the epoxy resin (B) preferably contains a glycidyl type epoxy resin having a glycidyl group, and more preferably contains one or more compounds selected from the group consisting of polyglycidyl ether compounds of polynuclear polyvalent phenol compounds, epoxy compounds having a glycidylamino group, and polyglycidyl ether compounds of dicyclopentadiene dimethanol. When the epoxy resin (B) contains a polyglycidyl ether compound of a polynuclear polyvalent phenol compound, heat resistance of the cured product can be further improved. When the epoxy resin (B) contains an epoxy compound having a glycidylamino group, reactivity of the photocurable adhesive 1 can be further improved, and heat resistance of the cured product can be further improved. When the epoxy resin (B) contains a polyglycidyl ether compound of dicyclopentadiene dimethanol, adhesion can be imparted to the photocurable adhesive 1.

1-3. Latent Amine Curing Agent (C)

As the latent amine curing agent (C), for example, compounds containing active hydrogen derived from amino groups, or mixtures containing at least one of these compounds can be used. The content of the latent amine curing agent (C) can be appropriately determined so as to be in the range of 1 part by mass or more and 100 parts by mass or less relative to 100 parts by mass of the cyanate ester resin (A) and the epoxy resin (B) in total. The content of the latent amine curing agent (C) is preferably 5 parts by mass to 60 parts by mass relative to 100 parts by mass of the cyanate ester resin (A) and the epoxy resin (B) in total.

The latent amine curing agent (C) may be, for example, a modified amine (C-1) obtainable by reaction of an amine compound having one or more active hydrogen atoms per molecule with an epoxy compound. The latent amine curing agent (C) may be formed of one modified amine (C-1), or two or more modified amines (C-1).

The modified amine (C-1) contains amine structural units derived from the amine compounds, and epoxy structural units derived from the epoxy compounds, i.e., has a structure in which the amine structural units and the epoxy structural units are bonded together. The amine compounds used for the modified amine (C-1) may be, for example, diamines having two primary and/or secondary amino groups per molecule, or polyamines having two or more primary and/or secondary amino groups per molecule. One of these amine compounds may be used alone or two or more of these amine compounds may be used in combination.

More specifically, the amine compounds used for the modified amine (C-1) may include aliphatic diamines and polyamines such as ethylenediamine, diethylenetriamine, triethylenetetramine, tetraethylenepentamine, polyoxypropylenediamine, and polyoxypropylenetriamine; alicyclic diamines and polyamines such as isophorone diamine, mensendiamine, bis(4-amino-3-methyldicyclohexyl) methane, diaminodicyclohexylmethane, bis(aminomethyl) cyclohexane, N-aminoethylpiperazine, and 3,9-bis(3-aminopropyl)-2,4,8,10-tetraoxaspiro (5.5) undecane; mononuclear diamines and polyamines such as m-phenylenediamine, p-phenylenediamine, tolylene-2,4-diamine, tolylene-2,6-diamine, mesitylene-2,4-diamine, mesitylene-2,6-diamine, 3,5-diethyltolylene-2,4-diamine, and 3,5-diethyltolylene-2,6-diamine; aromatic diamines and polyamines such as biphenylenediamine, 4,4-diaminodiphenylmethane, 2,5-naphthylenediamine, and 2,6-naphthylenediamine; and imidazole compounds having an amino group such as 2-aminopropylimidazole. Furthermore, the amine compounds used for the modified amine (C-1) may be epoxy modified amines obtainable by reaction of the compounds mentioned above with epoxy compounds. One of these amine compounds may be used alone or two or more of these amine compounds may be used in combination.

The modified amine (C-1) preferably has structural units which are derived from one or more amine compounds selected from the group consisting of diamines having two primary and/or secondary amino groups per molecule with different reactivities, and polyamines having two or more primary and/or secondary amino groups per molecule in which, when one of the amino groups reacts with an epoxy group, the steric hindrance reduces reactivity of the remaining primary and/or secondary amino groups with an epoxy group. The modified amine (C-1) obtainable using these amine compounds can improve adhesion of the photocurable adhesive 1 or physical properties of the cured product. It should be noted that the diamines mentioned above include aliphatic diamines, alicyclic diamines, and aromatic diamines. Also, the polyamines mentioned above include aliphatic polyamines, alicyclic polyamines, and aromatic polyamines.

Examples of such diamines may include isophorone diamine, menthane diamine, 2,2,4-trimethylhexamethylenediamine, 2,4,4-trimethylhexamethylenediamine and 1,2-diaminopropane, m-xylylenediamine, 1,3-bisaminocyclohexane, and N-aminoethylpiperazine.

Furthermore, imidazole compounds containing a primary amino group such as 2-aminopropylimidazole may also be used as the amine compounds. The modified amine (C-1) obtainable using such imidazole compounds can further improve cold curability of the photocurable adhesive 1, and therefore, the photocurable adhesive 1 can be cured more easily even at low temperatures.

The epoxy compounds used for the modified amine (C-1) may need to have one or more epoxy groups per molecule.

More specifically, the epoxy compounds used for the modified amine (C-1) may include monoglycidyl ether compounds such as phenyiglycidyl ether, allyl glycidyl ether, methyl glycidyl ether, butyl glycidyl ether, secondary butyl glycidyl ether, 2-ethylhexyl glycidyl ether, 2-methyloctyl glycidyl ether, and stearyl glycidyl ether; monoglycidyl ester compounds such as glycidyl esters of versatic acid; polyglycidyl ether compounds of mononuclear polyvalent phenolic compounds such as hydroquinone, resorcin, pyrocatechol, and phloroglucinol; polyglycidyl ether compounds of polynuclear polyvalent phenol compounds such as dihydroxynaphthalene, biphenol, methylene bisphenol (i.e., bisphenol F), methylene bis(orthocresol), ethylidene bisphenol, isopropylidene bisphenol (i.e., bisphenol A), isopropylidene bis(orthocresol), tetrabromobisphenol-A, 1,3-bis(4-hydroxycumylbenzene), 1,4-bis(4-hydroxycumylbenzene), 1,1,3-tris(4-hydroxyphenyl) butane, 1,1,2,2-tetra(4-hydroxyphenyl) ethane, thiobisphenol, sulfobisphenol, oxybisphenol, phenol novolak, orthocresol novolak, ethylphenol novolak, butylphenol novolak, octylphenol novolak, resorcin novolak, and terpene phenol; polyglycidyl ethers of polyhydric alcohols such as ethylene glycol, propylene glycol, butylene glycol, hexanediol, polyglycol, thiodiglycol, glycerin, trimethylolpropane, pentaerythritol, sorbitol, and bisphenol A ethylene oxide adduct; glycidyl esters of aliphatic, aromatic or alicyclic polybasic acid such as maleic acid, fumaric acid, itaconic acid, succinic acid, glutaric acid, suberic acid, adipic acid, azelaic acid, sebacic acid, dimeric acid, trimeric acid, phthalic acid, isophthalic acid, terephthalic acid, trimellitic acid, trimesic acid, pyromellitic acid, tetrahydrophthalic acid, hexahydrophthalic acid, and endomethylene tetrahydrophthalic acid; homopolymers or copolymers of glycidyl methacrylate; epoxy compounds having a glycidylamino group such as N,N-diglycidylaniline, bis (4-(N-methyl-N-glycidylamino) phenyl) methane, and diglycidyl orthotoluidine; epoxy compounds of cyclic olefin compounds such as vinyl cyclohexene diepoxide, dicyclopentadiene diepoxide, 3,4-epoxycyclohexylmethyl-3,4-epoxycyclohexanecarboxylate, 3,4-epoxy-6-methylcyclohexylmethyl-6-methylcyclohexanecarboxylate, and bis(3,4-epoxy-6-methylcyclohexylmethyl) adipate; epoxidized conjugated diene polymers such as epoxidized polybutadiene and epoxidized styrene-butadiene copolymer; and heterocyclic compounds such as triglycidyl isocyanurate.

One of these epoxy compounds may be used alone or two or more of these epoxy compounds may be used in combination.

The epoxy compounds used for the modified amine (C-1) is preferably polyglycidyl ether compounds having two or more epoxy groups per molecule, and is particularly preferred to be polyglycidyl ethers of bisphenol compounds such as methylene bisphenol (i.e., bisphenol F), methylene bis(orthocresol), ethylidene bisphenol, isopropylidene bisphenol (i.e., bisphenol A), and isopropylidene bis(orthocresol).

When preparing the modified amine (C-1), an amine compound and an epoxy compound may be reacted with each other so that primary and/or secondary amino groups remain after the reaction. For example, in the case where an amine compound having two or more primary and/or secondary amine groups per molecule is reacted with an epoxy compound, it is preferred that the epoxy compound is reacted in an amount corresponding to an epoxy equivalent of 0.5 to 2, and more preferably 0.8 to 1.5, relative to 1 mol of the amine compound.

The latent amine curing agent (C) may be a mixture (C-2) of the modified amine (C-1) and a phenolic resin. The mixture (C-2) may contain one modified amine (C-1), or may contain two or more modified amines (C-1). Similarly, the mixture (C-2) may contain one phenolic resin, or may contain two or more phenolic resins. When the mixture (C-2) is used as the latent amine curing agent (C), storage stability of the photocurable adhesive 1 can be further improved.

The phenolic resins used in combination with the modified amine (C-1) may be, for example, resins obtainable by polycondensation of phenols and aldehydes. Examples of the phenols may include phenol, cresol, ethylphenol, n-propylphenol, isopropylphenol, butylphenol, tertiary butylphenol, octylphenol, nonylphenol, dodecylphenol, cyclohexylphenol, chlorophenol, bromophenol, resorcin, catechol, hydroquinone, 2,2-bis(4-hydroxyphenyl) propane, 4,4'-thiodiphenol, dihydroxydiphenylmethane, naphthol, terpenephenol, and phenolate dicyclopentadiene. Also, the aldehydes may be, for example, formaldehyde.

In the mixture (C-2) of the modified amine (C-1) and a phenolic resin, the content of the phenolic resin may be appropriately determined in the range of, for example, 10 parts by mass or more and 100 parts by mass or less, relative to 100 parts by mass of the modified amine (C-1).

1-4. Filler

The epoxy adhesive component 11 may contain a filler 13 in addition to the cyanate ester resin (A), the epoxy resin (B), and the latent amine curing agent (C). When the filler 13 is mixed in the epoxy adhesive component 11, physical properties of the cured product of the photocurable adhesive 1 can be further improved. The filler 13 may be, for example, an inorganic filler such as silica, alumina, aluminum nitride, glass, boron nitride, titanium dioxide, kaolin, clay, talc, carbon fibers, iron oxide, diamond, or the like. The filler 13 preferably has transparency, and more preferably has transmittance of 80% or more for infrared laser light having a wavelength in the range of 800 nm to 1,100 nm. In this case, curability of the photocurable adhesive 1 can be improved.

2. Titanium Black

The photocurable adhesive 1 contains titanium black 12 in a content of 1 ppm by mass or more and 150 ppm by mass or less relative to 100 parts by mass of epoxy adhesive component 11. The titanium black 12 is in the form of black particles having titanium atoms, and has a good balance between transmittance and absorbance for near infrared light having a wavelength of 780 nm to 3 μm. Therefore, when near infrared laser light is applied to the photocurable adhesive 1 containing the titanium black 12 in the specific amount, the laser light can easily reach deep portions of the photocurable adhesive 1. Furthermore, the titanium black 12 has characteristics of generating heat when it has absorbed laser light. Thus, heat generation due to the titanium black 12 absorbing laser light can cure the entire epoxy adhesive component 11.

The content of the titanium black 12 is 1 ppm by mass or more and 150 ppm by mass or less relative to 100 parts by mass of the epoxy adhesive component 11. When the content of the titanium black 12 is 1 ppm by mass or more relative to 100 parts by mass of the epoxy adhesive component 11, the photocurable adhesive 1 can be sufficiently heated when laser light is applied thereto to thereby cure the epoxy adhesive component 11. From the perspective of further increasing the amount of heat generated by laser light irradiation, the content of the titanium black 12 is preferably 3 ppm by mass or more, and more preferably 5 ppm by mass or more, relative to 100 parts by mass of the epoxy adhesive component 11.

Furthermore, when the content of the titanium black 12 is 150 ppm by mass or less relative to 100 parts by mass of the epoxy adhesive component 11, laser light can reach deep portions of the photocurable adhesive 11 more easily and thus can further improve deep-section curability of the photocurable adhesive 1. From the perspective of further improving deep-section curability of the photocurable adhesive 1, the content of the titanium black 12 is preferably 120 ppm by mass or less relative to 100 parts by mass of the epoxy adhesive component 11.

The titanium black may be formed of primary particles, or may be formed of an aggregate of primary particles. The titanium black preferably has a primary particle size of 5 nm or more and 150 nm or less. In this case, transmittance and absorbance for near infrared light can be enhanced with a better balance. It should be noted that the primary particle size of the titanium black is calculated based on specific surface area, according to the Brunauer-Emmett-Teller (BET) method.

The photocurable adhesive 1 may contain one of the titanium black 12, or may contain two or more of the titanium black 12. The titanium black 12 may be a commercial product which may be, for example, 12S, 16M, 13M, 13M-C, 13M-T or UF-8 manufactured by Mitsubishi Materials Electronic Chemicals Co., Ltd., or Tilack D manufactured by Akao Kasei Co., Ltd., or the like. Furthermore, the titanium black 12 may be titanium black obtainable by baking titanium dioxide or titanium hydroxide, after adhesion of a vanadium compound thereto as necessary, at high temperature in the presence of a nitrogen-containing reducing agent, such as ammonia gas or amine gas, using a gas-phase reaction process, such as electric furnace process or thermal plasma process.

3. Other Components

The photocurable adhesive 1 may contain various additives used for adhesives, other than the epoxy adhesive component 11 and the titanium black 12.

For example, the photocurable adhesive 1 may contain various solvents to facilitate handling. The solvents are preferably organic solvents. More specifically, these solvents may be ethers such as tetrahydrofuran, 1,2-dimethoxyethane, and 1,2-diethoxyethane; alcohols such as iso- or n-butanol, iso- or n-propanol, amyl alcohol, benzyl alcohol, furfuryl alcohol, and tetrahydrofurfuryl alcohol; ketones such as methyl ethyl ketone, methyl isopropyl ketone, and methyl butyl ketone; aromatic hydrocarbons such as benzene, toluene, and xylene; triethylamine; pyridine; dioxane; acetonitrile; and the like.

It should be noted that the photocurable adhesive 1 may contain light-absorbing components other than the titanium black 12, within a range not adversely affecting deep-section curability. As the light-absorbing components other than the titanium black 12, for example, light-absorbing materials such as carbon black, black gold-containing coating materials, azine-based coating materials, and nigrosine-based compounds can be used. The nigrosine-based compounds may be, for example, water-insoluble nigrosine-based compounds such as sulfates and phosphates of nigrosine. The content of the light-absorbing components other than the titanium black 12 is preferably 10 ppm by mass or less, more preferably 1 ppm by mass or less, and even more preferably 0.1 ppm by mass, relative to 100 parts by mass of the epoxy adhesive component 11. In other words, it is most preferred that the photocurable adhesive 1 contains no light-absorbing components other than the titanium black 12.

Second Embodiment

In the present embodiment, a description will be given of an example of use of the photocurable adhesive 1 of the first embodiment. Of the reference signs used in the present embodiment and the subsequent embodiments, reference signs which are the same as those used in the foregoing embodiments indicate similar components and the like of the foregoing embodiments unless otherwise mentioned.

Figure 2:
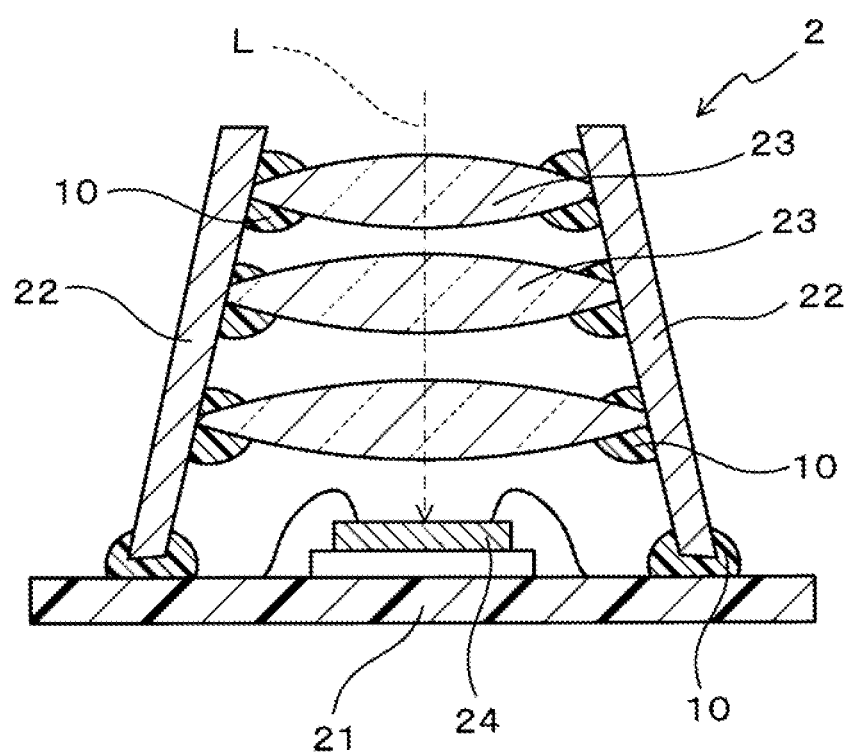
FIG. 2 is a cross-sectional view illustrating a principal part of a lens module to which a photocurable adhesive is applied, according to a second embodiment.

The photocurable adhesive 1 of the first embodiment can be applied to various uses. For example, the photocurable adhesive 1 may be used for bonding components together in a lens module 2 as shown in FIG. 2. The lens module 2 shown in FIG. 2 includes a circuit board 21, a lens holder 22 provided on the circuit board 21, one or more lenses 23 held by the lens holder 22, and an imaging device 24 held on the circuit board 21 so as to be located on an optical path L of the lenses 23. These components are bonded together via a cured product 10 of the photocurable adhesive 1. It should be noted that the lens holder 22 may hold optical filters instead of the lenses 23.

The photocurable adhesive 1 may be used in any mode as long as laser light can be applied to the photocurable adhesive 1 in the mode. For example, although not shown, the photocurable adhesive 1 may be applied to various bonding modes, such as butt bonding in which end faces of members are bonded together, end-face bonding in which a surface and an end face of flat plates are bonded together, and insertion bonding in which a member having a recess and a mating member inserted into the recess are bonded together. Furthermore, the photocurable adhesive 1 can also be used in various applications, such as thread locking agents, underfills used for sealing gaps between electronic parts and circuit boards, and protective materials for bonding-wires that connect between semiconductor elements and circuit boards.

Furthermore, the photocurable adhesive 1 has adhesion to those members which are made of various materials, and therefore, materials of the members targeted to bonding are not particularly limited. From the perspective of characteristics of the photocurable adhesive 1 in which portions thereof including portions near the surface of the base material can be efficiently cured, the photocurable adhesive 1 can be suitably used, for example, for surfaces of metal such as stainless steel, as targets of bonding, with which it has been difficult to achieve bonding and curing.

EXAMPLE

In the present example, more specific formulation of the photocurable adhesive 1 related to the first embodiment will be described. In the present example, there were prepared photocurable adhesives 1 (test agents S1 to S3) each containing the cyanate ester resin (A), epoxy resin (B), latent amine curing agent (C), titanium black 12, and filler 13 at a mass ratio shown in Table 1. The cyanate ester resin (A) used in the present example was a bisphenol type cyanate ester resin (LECy manufactured by Lonza), the epoxy resin (B) was a bisphenol type epoxy resin (ADEKA RESIN EP-4100E manufactured by Adeka Corporation), and the filler 13 was silica (FB-975FD manufactured by Denka Company Limited). It should be noted that ADEKA RESIN is a registered trademark of Adeka Corporation.

As the titanium black 12, three types of titanium black different from each other in primary particle size were prepared. The types of titanium black 12 used in the present example were specifically as follows.
- P-1: Titanium black with a primary particle size of 97 nm (13M-C manufactured by Mitsubishi Materials Electronic Chemicals Co., Ltd.)
- P-2: Titanium black with a primary particle size of 75 nm (13M manufactured by Mitsubishi Materials Electronic Chemicals Co., Ltd.)
- P-3: Titanium black with a primary particle size of 20 nm (UF8 manufactured by Mitsubishi Materials Electronic Chemicals Co., Ltd.)

The latent amine curing agent (C) used was a mixture (C-2) of the modified amine (C-1) and a phenolic resin. The modified amine (C-1) and the mixture (C-2) used in the present example were prepared through the following processes.

First, 201 g (i.e., 2.71 mol) of 1,2-diaminopropane placed in a flask was heated to 60° C. Next, while the temperature in the system was maintained in the range of 100° C. to 110° C., 580 g of bisphenol A type epoxy resin (ADEKA RESIN EP-4100E manufactured by Adeka Corporation, epoxy equivalent: 190) was gradually added to the flask. It should be noted that when the 1,2-diaminopropane and the bisphenol A type epoxy resin are mixed with each other as mentioned above, the epoxy equivalent of the bisphenol A type epoxy resin relative to 1 mol of the 1,2-diaminopropane is 1.12.

After completing addition of the bisphenol A type epoxy resin, the temperature inside the reaction system was raised to 140° C., and this temperature was maintained for 1.5 hours to cause reaction in the contents. Through the process described above, a modified amine (C-2) was obtained.

Next, 100 g of the modified amine (C-1) obtained through the above process was mixed with 30 g of phenolic resin (MP-800K manufactured by Asahi Yukizai Corporation, softening temperature: 100° C.), and the mixture was left to stand at a temperature of 180° C. to 190° C. for 1 hour in the reduced pressure environment of 30 Torr to 40 Torr, for decompression and degassing. Thus, unreacted materials were removed from the mixture. After that, the mixture was ground in a jet mill. Through the process described above, a mixture (C-2) was obtained.

In the present example, test agents S4 to S7 were prepared for comparison with the text agents S1 to 53. The test agent S4 was formulated similarly to the test agents S1 to S3 except that no titanium black 12 was contained therein. The test agent S5 was formulated similarly to the test agent S1 except that the mixing amount of the titanium black 12 was different. The test agents S6 and S7 were formulated similarly to the test agents S1 to S3 except that carbon black (#750B manufactured by Mitsubishi Carbon Black Corporation, primary particle size: 22 nm) was used instead of titanium black.

Next, the test agents S1 to S4 were evaluated in terms of deep-section curability through the following process. First, a mold frame made of silicone was placed on a base material of SUS430 which was degreased with acetone, and any of the test agents S1 to S7 was injected into the mold frame. It should be noted that the mold frame had a rectangular shape with a thickness of 1 mm, and an inner dimension of 2 mm in length and 3 mm in width.

Next, near infrared laser light having a wavelength of 915 nm was applied to the test agent in the mold frame to cure the test agent. The output and irradiation time of the near infrared laser were as shown in Table 1. After irradiating the test agent with laser light, the mold frame was removed from the base material. Through the process described above, there was obtained a test specimen where a cured product of the test agent with a length of 2 mm, width of 3 mm, and a thickness of 1 mm was formed on the base material.

The base material of the obtained test specimen was loaded on a bond strength tester (4000Plus bond tester manufactured by Nordson DAGE) and the cured product was pressed using a tool to add a shear force thereto. Then, based on the test force at the point when the cured product was detached from the base material, a shear bond strength of the cured product was calculated. It should be noted that the moving speed of the tool was 200 μm/sec, and the distance between the surface of the base material and the tool was 100 μm.

When the shear bond strength of the cured product was 1.0 MPa or more, a symbol A was marked in the column of deep-section curability of Table 1, and when it was less than 1.0 MPa, a symbol B was marked in the column. The specimen with the symbol A in which the cured product had a shear bond strength of 1.0 MPa or more was evaluated to have good deep-section curability, and the specimen with the symbol B in which the cured product had a shear bond strength of less than 1.0 MPa was evaluated to have poor deep-section curability.

On the other hand, the test agent 54 did not contain a component that could absorb laser light. Therefore, the test agent S4 could not be sufficiently cured by laser light irradiation.

The test agent S5 contained the titanium black 12 exceeding the specific range in an amount. Therefore, the laser light applied did not reach sufficiently deep into the test agent S5, and the deep portions of the test agent S5 could not be sufficiently cured.

The test agents S6 and S7 contained carbon black instead of the titanium black 12, as a component that could absorb laser light. Therefore, the laser light applied did not reach sufficiently deep into these test agents, and the deep portions of these test agents could not be sufficiently cured.

The present disclosure should not be construed as being limited to the embodiments and the mode of the example described above, but may be applied to various embodiments without departing from the spirit of the present disclosure.

What is claimed is:

1. A photocurable adhesive formulated to be curable by laser light irradiation, comprising
    an epoxy adhesive component; and
    titanium black in a content of 1 ppm by mass or more and 150 ppm by mass or less relative to 100 parts by mass of the epoxy adhesive component,
    wherein the titanium black has a primary particle size of 5 nm or more and 150 nm or less.

2. The photocurable adhesive according to claim 1, wherein the epoxy adhesive component contains a cyanate ester resin, an epoxy resin, and a latent amine curing agent.

3. The photocurable adhesive according to claim 2, wherein the latent amine curing agent is at least one selected from a group consisting of a modified amine obtainable by reaction of an amine compound having one or more active hydrogen atoms per molecule with an epoxy compound, and a mixture of the modified amine and a phenolic resin.

4. The photocurable adhesive according to claim 3, wherein the latent amine curing agent is a mixture of the modified amine and the phenolic resin.

5. The photocurable adhesive according to claim 2, wherein the cyanate ester resin is at least one selected from a group consisting of compounds expressed by the following General Formula (1), compounds expressed by the follow-

TABLE 1

|  |  | T.A. S1 | T.A. S2 | T.A. S3 | T.A. S4 | T.A. S5 | T.A. S6 | T.A. S7 |
|---|---|---|---|---|---|---|---|---|
| Cyanate ester resin (A) | Mass parts | 9.0 | 9.0 | 9.0 | 9.0 | 9.0 | 9.0 | 9.0 |
| Epoxy resin (B) | Mass parts | 15.0 | 15.0 | 15.0 | 15.0 | 15.0 | 15.0 | 15.0 |
| Latent amin curing agent (C) | Mass parts | 9.0 | 9.0 | 9.0 | 9.0 | 9.0 | 9.0 | 9.0 |
| Filler | Mass parts | 67.0 | 67.0 | 67.0 | 67.0 | 66.9 | 67.0 | 67.0 |
| Titanium black P-1 | Mass parts | 0.0025 | — | — | — | 0.0600 | — | — |
| Titanium black P-2 | Mass parts | — | 0.0090 | — | — | — | — | — |
| Titanium black P-3 | Mass parts | — | — | 0.0005 | — | — | — | — |
| Carbon black | Mass parts | — | — | — | — | — | 0.0050 | 0.0100 |
| Laser output | W | 15 | 9 | 15 | 15 | 15 | 15 | 5 |
| Irradiation time | Seconds | 2 | 5 | 7 | 7 | 2 | 2 | 10 |
| Deep-section curability | — | A | A | A | B | B | B | B |

(T.A. = Test Agent)

As shown in Table 1, the test agents S1 to S3 contained the specific amount of the titanium black 12. Therefore, when laser light was applied to these test agents, the laser light reached deep into the test agents and the test agents could be entirely cured.

ing General Formula (2), and polymers which are polymers of at least one of the compounds expressed by General Formula (1) and/or General Formula (2),

$N{\equiv}C{-}O{-}A^1{-}Y^1{-}A^2{-}O{-}C{\equiv}N$   General Formula (1)

(In General Formula (1), $A^1$ and $A^2$ each independently represent an unsubstituted phenylene group, or a phenylene group substituted with one or more of alkyl groups having 1 to 4 carbon atoms, and $Y^1$ represents a divalent hydrocarbon group that may have an ether bond, thioether bond, or substituent group), General Formula (2)

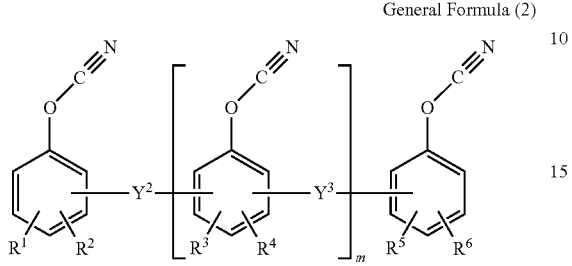

(In General Formula (2), m represents an integer equal to or greater than 1, $R^1$ to $R^6$ each independently represent a hydrogen atom or an alkyl group having 1 to 4 carbon atoms, and $Y^2$ and $Y^3$ each independently represent a divalent hydrocarbon group or a fluorine-substituted divalent alkylene group).

6. The photocurable adhesive according to claim 5, wherein $Y^1$ in General Formula (1) and $Y^2$ and $Y^3$ in General Formula (2) are each at least one of divalent hydrocarbon groups expressed by the following Structural Formulae (3) to (11), Structural Formula (3)

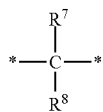

(In Structural Formula (3), the mark * represents atomic bonding, and $R^7$ and $R^8$ each independently represent a hydrogen atom, an unsubstituted methyl group, or a fluorine-substituted methyl group), Structural Formula (4)

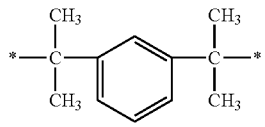

(In Structural Formula (4), the mark * represents atomic bonding),

Structural Formula (5)

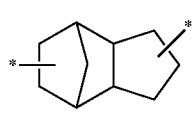

(In Structural Formula (5), the mark * represents atomic bonding),

*—S—*  Structural Formula (6)

(In Structural Formula (6), the mark * represents atomic bonding),

Structural Formula (7)

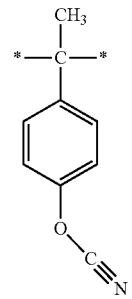

(In Structural Formula (7), the mark * represents atomic bonding),

Structural Formula (8)

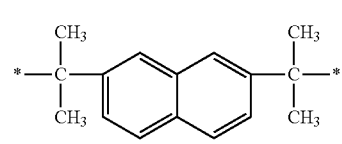

(In Structural Formula (8), the mark * represents atomic bonding),

Structural Formula (9)

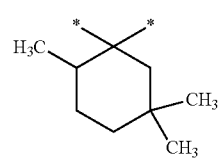

(In Structural Formula (9), the mark * represents atomic bonding),

Structural Formula (10)

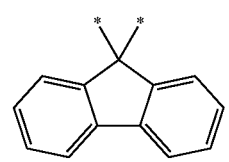

(In Structural Formula (10), the mark * represents atomic bonding),

Structural Formula (11)

(In Structural Formula (11), n represents an integer that is 4 or greater and 12 or smaller, and the mark * represents atomic bonding).